United States Patent
Bouyat

(10) Patent No.: US 8,339,154 B2
(45) Date of Patent: Dec. 25, 2012

(54) BUILT-IN LINE TEST METHOD

(75) Inventor: Stéphane Bouyat, Saint Cyr (FR)

(73) Assignee: Thales, Neuilly-sur-Seine (FR)

( * ) Notice: Subject to any disclaimer, the term of this patent is extended or adjusted under 35 U.S.C. 154(b) by 183 days.

(21) Appl. No.: 12/726,077

(22) Filed: Mar. 17, 2010

(65) Prior Publication Data

US 2011/0084723 A1    Apr. 14, 2011

(30) Foreign Application Priority Data

Mar. 17, 2009   (FR) ..................... 09 01234

(51) Int. Cl.
*H03K 19/00* (2006.01)
*G01R 31/28* (2006.01)
*G11C 7/00* (2006.01)

(52) U.S. Cl. ......................... 326/16; 714/726; 365/200

(58) Field of Classification Search ............. 326/16, 326/37–41; 714/726–737, 719–723, 710, 714/711

See application file for complete search history.

(56) References Cited

U.S. PATENT DOCUMENTS

| | | | | |
|---|---|---|---|---|
| 6,266,793 B1 * | 7/2001 | Mozdzen et al. | ............. | 714/727 |
| 6,297,643 B2 * | 10/2001 | De Jong et al. | ............... | 324/537 |
| 7,046,035 B2 * | 5/2006 | Piasecki et al. | ................ | 326/41 |
| 7,406,642 B1 * | 7/2008 | Lau | ............................... | 714/727 |
| 7,626,861 B1 * | 12/2009 | Lakkapragada et al. | . | 365/185.08 |
| 7,973,563 B2 * | 7/2011 | Tran et al. | ...................... | 326/86 |
| 2004/0003332 A1 * | 1/2004 | Kim et al. | ..................... | 714/744 |
| 2004/0123195 A1 | 6/2004 | Rohrbaugh et al. | | |

FOREIGN PATENT DOCUMENTS

WO    97/14974 A1    4/1997
WO    99/40448 A1    8/1999

* cited by examiner

*Primary Examiner* — Shawki Ismail
*Assistant Examiner* — Dylan White
(74) *Attorney, Agent, or Firm* — Baker & Hostetler LLP

(57) ABSTRACT

A method for testing a line including an input/output pin of a programmable logic circuit, said line including at least one individual line extending from the input/output pin to a peripheral element, said input/output pin being able to be either at a high logic level or at a low logic level opposite to the high logic level. The method includes, between an initial driving instant and a final driving instant, a step for driving the input/output pin in which a driving voltage is applied to the terminals of the input/output pin. The method also includes: from the final driving instant, a step for measuring the level of the input/output pin during which the pin is no longer driven and during which the measured logic level is recorded for the input/output pin at least one measuring instant, and the measured logic level(s) is/are compared, at the (respective) measuring instant(s), with the theoretical logic level(s) at which the input/output pin should be at the (respective) measuring instant(s) in the absence of any line failure, and, when at least one logic level measured at a measuring instant differs from the theoretical logic level at said measuring instant, a line failure is detected.

11 Claims, 5 Drawing Sheets

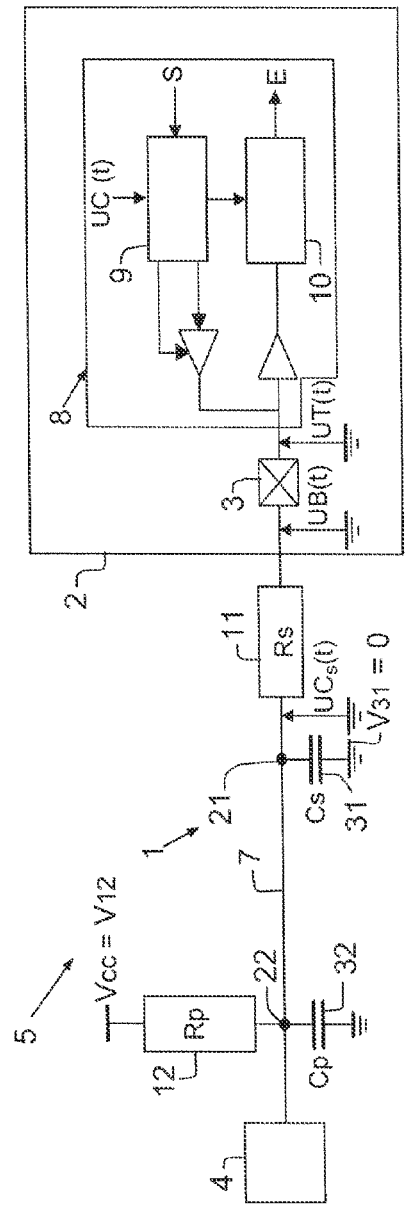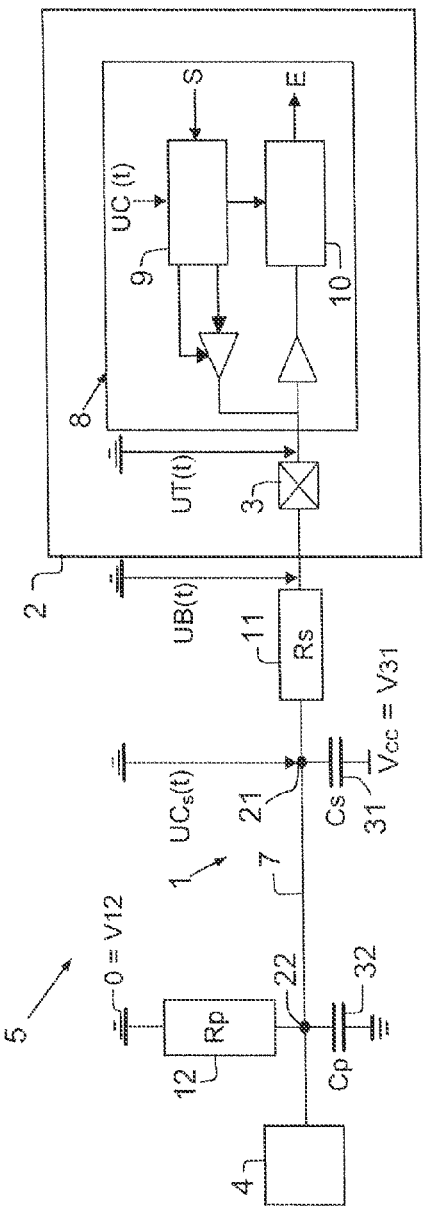

BUILT-IN LINE TEST METHOD

CROSS-REFERENCE TO RELATED APPLICATIONS

This application claims priority to foreign France patent application No. 0901234, filed on Mar. 17, 2009, the disclosure of which is hereby incorporated by reference in its entirety.

FIELD OF THE INVENTION

The field of the invention is that of built-in test (BIT) methods, also called line self-tests, comprising an input/output pin of a programmable logic circuit connected to at least one peripheral element. The expression "self-test method" should be understood to mean that the line is able to implement the test method able to detect a failure of the line and possibly identify the origin of the failure of that line.

These tests can be performed in the production phase for equipment comprising the lines to be tested or even in the operational phase (in operation or at the start of operation) of the lines to be tested.

BACKGROUND OF THE INVENTION

Line test methods are known which consist in applying logic signals to a first output pin of a first circuit and in recording the logic levels on the input pin of the second circuit that is connected to the first output pin. The logic levels measured on the input pin of the second component are compared to expected levels. If these levels differ, the line is considered to be defective. However, this type of method is costly because it requires heavy test equipment. In practice, it is necessary to incorporate in the line to be tested an element that makes it possible to generate the output logic signals, an element that makes it possible to measure the input logic level, and an element for synchronizing the input and output pins of the first and the second circuits so as to attribute the response from the input pin to a logic signal applied to the output pin. The expression "false alarm" is used to mean the detection of a failure of the line being tested when the line has not failed. The methods described previously present a high false alarm rate. It is indeed possible to detect a failure of the line that is actually due to a failure of one of the elements of the test equipment.

SUMMARY OF THE INVENTION

The aim of the invention is to propose a built-in line test method that is inexpensive, and that presents a restricted false alarm rate. Another aim of the invention is to propose a line test method that makes it possible to identify, with good performance levels, the origin of the failures detected. Yet another aim of the invention is to propose a line able to implement the inventive method.

The subject of the invention is a method for testing a line comprising an input/output pin of a programmable logic circuit, said line comprising at least one individual line extending from the input/output pin to a peripheral element, said input/output pin being able to be either at a high logic level or at a low logic level opposite to the high logic level, said method comprising the following steps:

between an initial driving instant and a final driving instant, a step for driving the input/output pin in which a driving voltage is applied to the terminals of the input/output pin, said method also comprising the following steps:

from the final driving instant, a step for measuring the level of the input/output pin during which the pin is no longer driven and during which a measured logic level is recorded for the input/output pin at least one measuring instant, the measured logic level(s) is/are compared, at the (respective) measuring instant(s), with the theoretical logic level(s) at which the input/output pin should be at the (respective) measuring instant(s) in the absence of any line failure, when at least one logic level measured at a measuring instant differs from the theoretical logic level at said measuring instant, a line failure is detected.

The inventive method can also present one or more of the following characteristics taken together or separately:

it is defined that, when the input/output pin is not driven:
 it is at the high logic level when the voltage at its terminals is greater than a minimum high level input voltage and at the low logic level when the voltage at its terminals is less than a maximum low level input voltage,
 when it is in steady state operation, that is to say when a permanent voltage is applied to its terminals, it is at a first logic level whose value depends on the value of the permanent voltage,
and the value of the driving voltage, applied during the driving phase of the test method, is chosen so as to place the pin at a second logic level, opposite to the first logic level, in the measuring phase, the line forms an RC circuit so that the theoretical voltage at the terminals of the input/output pin changes from the driving voltage to the permanent voltage with a theoretical driving absence time constant, the measured logic level of the input/output pin is recorded at least one measuring instant at which the theoretical voltage of the pin does not lie between the maximum low level input voltage and the minimum high level input voltage, the theoretical driving absence time constant of the RC circuit is equal to the product of the theoretical resistance and of the theoretical capacitance of the RC circuit, the theoretical resistance and the theoretical capacitance of the RC circuit are either respectively equal to the resistance and to the capacitance of the line, in the absence of driving and line failure, or respectively equal to an approximation of these values, the measured logic level is recorded at least one measuring instant at which the theoretical logic level is the second logic level and at least one measuring instant at which the theoretical logic level is equal to the first theoretical logic level, the measured logic level is recorded at least two measuring instants at which the theoretical logic level is the second logic level and at least two measuring instants at which the theoretical logic level is equal to the first theoretical logic level, when the failure is detected, it also comprises a step for identifying the origin of the failure according to the measured logic levels and the theoretical levels at the respective measuring instants, the logic level of the pin is recorded at a first instant and then at a second instant at which the theoretical logic level is the second logic level, then at a third instant and at a fourth instant at which the theoretical logic level is the first theoretical logic level and, if the measured logic levels change from the second logic level to the first logic level with delay, respectively in advance, relative to the theoretical logic levels, the origin of the failure is attributed to the fact that the second real time constant of the line is greater, respectively less, than the line's theoretical time constant, the logic level of the pin is recorded at a first instant and then at a second instant at which the theoretical logic level is the second logic level, then at a third instant and at a fourth instant at which the theoretical logic level is the first theoretical logic level, and:

when the first logic level is the high logic level, if, at the four measuring instants, the high logic level is recorded, the origin of the failure is attributed to a short circuit to a potential greater than the minimum high level input voltage, when the first logic level is the low logic level, if, at the four measuring instants, the low logic level is recorded, the origin of the failure is attributed to a short circuit to a potential less than the maximum low level input voltage, it also comprises a step for correcting the failure, the first logic level is known, prior to the driving phase, a phase for determining the first logic level is carried out, in which the input/output pin is not driven and in which the logic level of the input/output pin is measured, the measured logic level being considered to be equal to the first logic level.

Another subject of the invention is a line comprising an input/output pin of a programmable logic circuit, a controller able to apply a driving voltage to the terminals of the input/output pin and to record the logic level of the input/output pin, the line also comprising at least one individual line extending from the input/output pin to a peripheral element, said individual line comprising:

a first resistance, the value of which is a first resistance value, arranged in series with the input/output pin and connected, on the one hand, to a first node and, on the other hand, to the input/output pin, a first capacitance, the value of which is the first capacitance value, arranged in parallel with the input/output pin and connected, on the one hand, to the first node and, on the other hand, to a first capacitance potential, a second node connected to the peripheral element and to wiring, a second resistance, connected to a second resistance potential and to the first node via the wiring, a second capacitance connected to the second node and to ground.

The line according to the invention can also present one or more of the following characteristics taken together or separately:

the second resistance comprises a pull-up resistance, the first capacitor potential is zero, the second resistance potential is greater than or equal to the minimum high level input voltage such that the first logic state is the high level, the second resistance comprises a pull-down resistance, the first capacitor potential is greater than or equal to the minimum high level input voltage, the second resistance potential is zero such that the first logic state is the low level, it comprises a means of detecting the origin of a failure and possibly a means of correcting the failure.

The method according to the invention presents the advantage of making it possible to test, immaterially and with the same topology, any input or output line of the programmable logic circuit.

The method according to the invention presents the advantages of being inexpensive and of detecting the deficiencies of a line with a low false alarm rate. Implementing the method does not entail adding test-specific components other than passive resistor or capacitor type components. However, the latter components are generally present on the line to be tested and, even if they are added specifically to implement the method according to the invention, they only minimally degrade the false alarm rate because they are passive components (resistors and/or capacitors). Furthermore, these components are inexpensive. Furthermore, given that the input/output pin of the programmable logic circuit is controlled and that the logic level of this same pin is recorded, it is not necessary to incorporate a synchronization element between the external element and the input/output pin, specifically for the test.

The self-test method according to the invention makes it possible to identify, with good performance levels, the origin of a failure of the line and possibly correct this failure.

The method according to the invention can also be used both in production and in operation because it does not require any equipment external to the line.

BRIEF DESCRIPTION OF THE DRAWINGS

Other characteristics and advantages of the invention will become apparent on reading the detailed description that follows, given by way of non-limiting example, and with reference to the appended drawings in which:

FIG. 1a diagrammatically represents a line according to a first embodiment and FIG. 1b represents timing diagrams representing, during the implementation of the method according to the first embodiment, the change over time of the signal received by the controller UC(t), of the test signal UT(t), of the theoretical voltage at the terminals of the first capacitor UC(t), of the theoretical voltage at the terminals of the input/output pin UBT(t), of the theoretical logic level LT(t) of the input/output pin, FIG. 2a diagrammatically represents a line according to a second embodiment

From one figure to another, the same elements are identified by the same references.

DETAILED DESCRIPTION

Figure 1B:
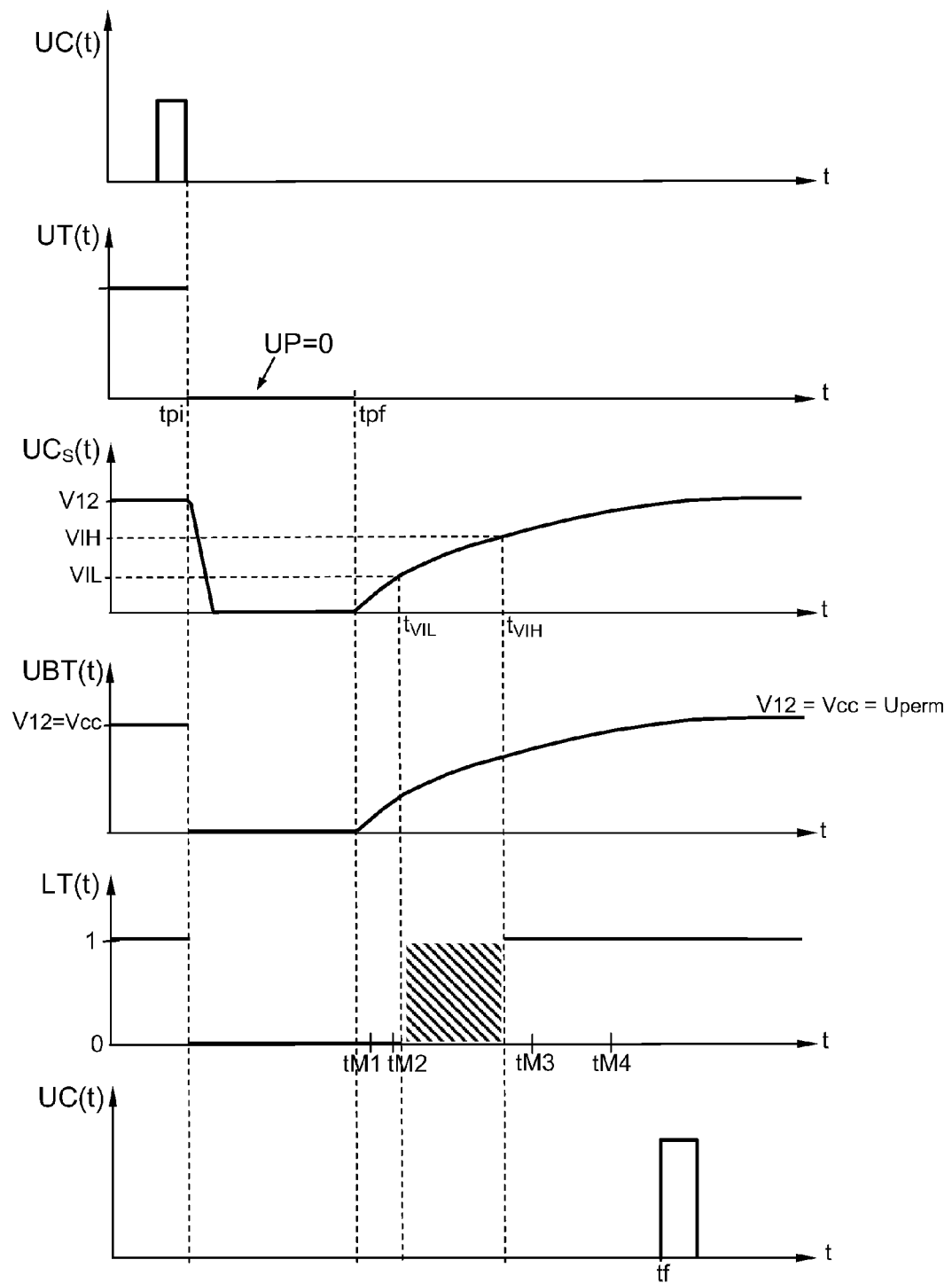

FIG. 1a shows a line 5 according to a first embodiment of the invention. This line comprises an input/output pin 3 of a programmable logic circuit 2 and a peripheral element 4. The line 5 also comprises a controller 8, which is linked to the input/output pin 3 of the programmable logic circuit 2. The line extending from the peripheral element 4 to the input/output pin 3 is an individual line 1.

The programmable logic circuit is, for example, of the FPGA (field programmable gate array) type and has one or more input/output pins 3. The peripheral element is, for example, a programmable logic circuit or a circuit comprising a switch or a transistor linked to ground or even another type of integrated circuit.

The individual line 1 also comprises wiring 7 electrically linking the input/output pin 3 to the peripheral element 4 as well as resistances and capacitances that will be described later.

The input/output pin 3 is able to be either at a high logic level ("1" level) or at a low logic level ("0" level). These two logic levels are said to be logic levels opposite to one another.

Hereinafter in the text, the terms "linked" or "connected" should be understood to mean electrically linked. The individual line 1 comprises a first resistance 11, with a first resistance value Rs, which is arranged in series with the input/output pin 3 and which is connected, on the one hand, directly to a first node 21, and, on the other hand, directly to the input/output pin 3. The term "directly" should be understood to mean that the resistance is connected to the input/output pin 3 via wiring of negligible resistance and capacitance or else the resistance is the resistance of the wiring that links the first node 21 to the input/output pin 3. As a variant, the first node 21 is not directly linked to the input/output pin 3.

The individual line 1 also comprises a first capacitance 31, with a first capacitance value Cs, which is arranged in parallel with the input/output pin 3 and is connected, on the one hand, directly to the first node 21, and, on the other hand, to a first capacitance potential V31. The voltage between the first node 21 and ground is called the voltage at the terminals of the first capacitor $UC_s$. In the line according to the first embodiment of the invention, the first capacitance potential V31 is zero, the first capacitance is linked to ground. A second node 22 is linked to the first node 21 via the wiring 7.

The individual line 1 also comprises a second resistance 12 connected to a second resistance potential V12 and to the second node 22 via the wiring 7 having negligible resistance and capacitance.

In the individual line 1 according to the first embodiment, said second resistance 12 is a resistance arranged in parallel with the peripheral element 4 and connected, on the one hand, to a second resistance potential V12=Vcc and, on the other hand, directly to the second node 22. The second resistance potential V12, the value of which is equal to Vcc, is positive and is greater than the minimum high level input voltage VIH which will be described later. It is said that the second resistance 12, which is a resistance arranged in parallel with the peripheral element 4 and which is connected to a potential greater than the minimum high level input voltage VIH, is a resistance for pulling up to the high logic level.

The line also comprises a second capacitance 32 connected to the second node 22 and to ground.

FIG. 2a shows a line according to a second embodiment of the invention. The elements that are common to FIG. 2a and FIG. 1a are designated by the same numerical references and will not be described again.

In the second embodiment, the second resistance potential V12 is zero, the second resistance is linked to ground, whereas the first capacitance potential V31 (equal to Vcc) is positive and is greater than or equal to the minimum high level input voltage VIH. The second resistance is a resistance for pulling down to the low logic level.

The resistances and capacitances described previously are conventionally present on the lines. If they are not present, they are incorporated therein so as to be able to implement the test method according to the invention. These resistances and capacitances are either wiring resistances and capacitances, or resistors and capacitors, in the form of components, integrated between the wirings.

The value Rs of the first resistance 11 is, preferably, negligible compared to the value Rp of the second resistance 12. The expression "negligible" should be understood to mean that the value Rs of the first resistance is at least 5 times lower, preferably 10 times lower, than the value Rp of the second resistance 12. Preferably, the value Cp of the second capacitance 32 is negligible compared to the value Cs of the first capacitance 31.

The line 5 also comprises a controller 8 comprising a signal generator 9 which is able, during the test phase, either to drive the input/output pin 3, by generating a test signal UT(t), or to not drive this pin, that is to say to leave the pin floating by not applying any test signal to it. The controller comprises a measuring means 10, able to record the state of the input/output pin 3.

Outside of the test phase (in nominal operation), the controller is rendered transparent with respect to the internal logic of the programmable logic circuit. The expression "transparent" should be understood to mean that the controller does not operate and that it is the programmable logic circuit that drives the input/output pin or that leaves it floating (the logic circuit directly transmits its input instructions E to the pin 3 which transmits information S directly to the logic circuit. Everything takes place as if the controller were inactive).

A first logic level L1 of the input/output pin 3 is defined to be either the high logic level, or the low logic level. The first logic level L1 is the level at which the pin is when the latter is in a permanent state in which it is not driven. It is said that the pin is not driven when it is driven neither by the programmable logic circuit 2 nor by the signal generator 9.

The logic level is defined by the value of the permanent voltage Uperm at the terminals of the pin 3 in steady state operation. When the input/output pin 3 behaves like an input (when it is not driven), it is at the high logic level when the voltage of the pin UB(t) is greater than a minimum high level input voltage VIH and at the low level when the voltage of the input/output pin 3 is less than the maximum low level input voltage VIL.

In the line according to the first embodiment represented in FIG. 1, the input/output pin 3 is configured as an output in nominal operating mode (the peripheral element is an input). When the driving of the pin is stopped, and in the absence of any line failure, the pin behaves like an input (high impedance), the first capacitor passes through a transition period in which it is charged until the voltage at its terminals $UC_s(t)$ reaches the steady state operation voltage Uperm which is equal to the potential of the second resistance V12 greater than VIH. As in the absence of driving, no current flows in the first resistance, the voltage at the terminals of the pin is equal to the voltage at the terminals of the first capacitor. The first logic level L1 is then the high level.

As a variant, the line according to the first embodiment is configured as an input in nominal operating mode and the nominal logic level imposed by the peripheral element (output) is the high level because it imposes on the terminals of the pin a voltage equal to the second resistance potential which is greater than VIH. For example, the peripheral element is a switch or a transistor that is open in nominal mode, linked on the one hand to the second node 22 and on the other hand to ground. As a variant, the peripheral element is a logic input of the Boolean type.

In the line according to the second embodiment represented in FIG. 2a, the first logic level L1 is the low level when, for example, the input/output pin 3 is configured as an output in nominal mode and its logic level is the low level. For example, the peripheral element is a switch or a transistor, closed in nominal mode, linked on the one hand to the second node 22 and on the other hand to ground.

There now follows a description of the test method according to the invention.

The method for testing the line 5 consists in detecting the line failures, possibly in identifying the origin of the failure and possibly in correcting the detected failure.

Figure 2B:
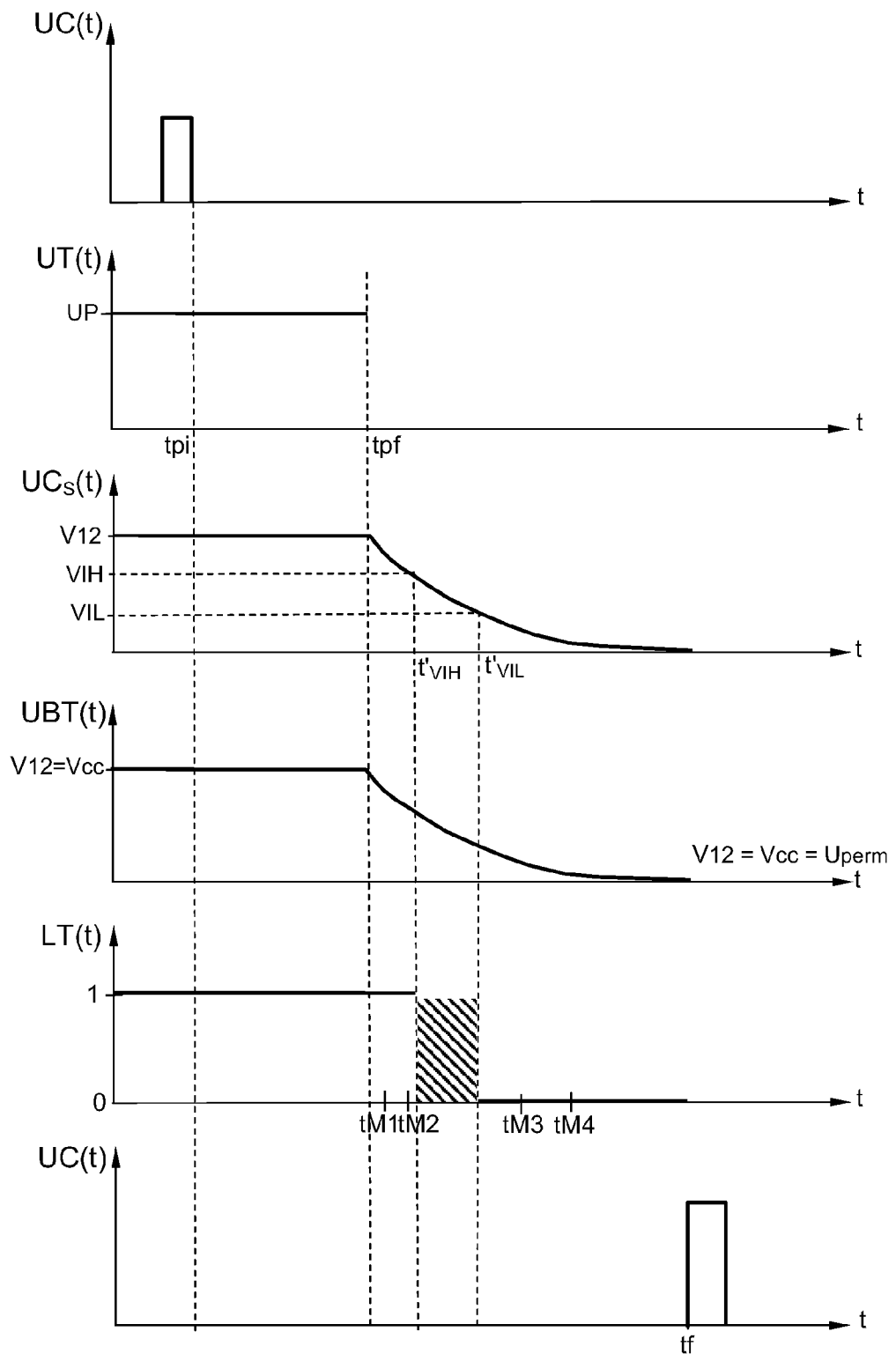
FIG. 2b represents timing diagrams representing, during the implementation of the method according to the second embodiment, the change over time of the signal received by the controller UC(t), of the test signal UT(t), of the theoretical voltage at the terminals of the first capacitor UCs(t), of the theoretical voltage at the terminals of the input/output pin UBT(t), of the theoretical logic level LT(t) of the input/output pin, FIG. 3 diagrammatically represents a line comprising several individual lines, FIG. 4 diagrammatically represents methods for testing a line.

FIGS. 1b and 2b show, for the method according to a first embodiment and respectively a second embodiment, timing diagrams representing the change over time of the signal received by the controller 8 UC(t), of the test signal UT(t), of the theoretical voltage at the terminals of the first capacitor $UC_s(t)$, of the theoretical voltage at the terminals of the input/output pin UBT(t), of the theoretical logic level LT(t) of the input/output pin 3. The theoretical voltage at the terminals of the input/output pin 3 is the voltage difference between the voltage of the pin and ground.

The expression "theoretical potential" should be understood to mean the potential that should exist in the absence of failure of the line.

In the exemplary methods represented in FIGS. 1b and 2b, the theoretical voltage of the pin and the voltage at the terminals of the first capacitor are equal to the second resistance potential V12(t) and the state of the pin (and the theoretical state) is the high level, before the test. The test method that is described hereinbelow is independent of these values.

First of all, as can be seen in FIGS. 1b and 2b, the signal generator 9 receives a test start signal UC(t), for example in the form of a voltage pulse. The signal generator 9 generates a test signal UT(t) which is a voltage pulse with a value equal to a driving voltage UP, applied between an initial driving instant tpi and a final driving instant tpf to the input/output pin 3. The theoretical voltage at the terminals of the pin UBT(t) between the initial driving instant tpi and the final driving instant tpf is equal to the driving voltage UP.

The method according to the first embodiment applies to and is implemented by lines whose first logic level is the high level. In this embodiment, the driving voltage UP is zero, as can be seen in FIG. 1b, so as to set the pin to the low logic level. The driving voltage is chosen in such a way as to set the pin 3 to the second state (opposite to the first state), it is therefore less than or equal to a maximum low level output voltage VOL below which the pin is at the low level in output mode.

Between the initial driving instant tpi and the final driving instant tpf, the theoretical voltage at the terminals of the first capacitor $UC_s$ changes to the driving voltage UP with a theoretical driving time constant τp equal to:

$$\tau p = Cs * Rs$$

Advantageously, the test voltage UT(t) is applied for a duration at least 5 times equal to the theoretical driving time constant so that the theoretical voltage at the terminals of the first capacitor $UC_s$ changes to the driving voltage during the driving phase.

At the final driving instant, the sequence generator 9 stops driving the first input/output pin 3 until the end of the test, and this is a measuring phase. The test is stopped when it receives a second test signal at a final test instant tf.

During the measuring phase, the input/output pin 3 which is not driven then behaves as an input (high impedance) and the theoretical voltage at its terminals UBT(t–tpf) is equal to the theoretical voltage at the terminals of the first capacitance because the current does not flow in the first resistance 11. The line then forms an RC circuit between the first node 21 and the second node 22. The theoretical voltage UBT(t–tpf) at the terminals of the pin 3 then changes to the steady state operation voltage Uperm which is the potential of the second resistance V12 equal to Vcc with a theoretical driving absence time constant Dnp because the first capacitor 31 is charged with the same time constant.

The theoretical voltage UBT(t) of the pin 3 increases to the theoretical steady state operation voltage Uperm=V12 in the following manner according to time from the final driving instant tpf:

$$UBT(t-tpf) = Vcc(1 - e^{-(t-tpf)/\tau 2})$$

The theoretical driving absence time constant τnp is given by the following formula:

$$\tau np = R * C$$

in which R is the value of the theoretical resistance of the RC circuit and C is the theoretical capacitance of the RC circuit, which are respectively equal to the resistance and the capacitance of the line during the driving absence phase and in the absence of line failure. When the line comprises a single individual line 1, the resistance of the line in the absence of driving and failure of the line is equal to the resistance of the individual line Ri which is given by the following formula:

$$Ri = Rp$$

because the capacitance of the line is charged only through the second resistance.

The value of the capacitance of the individual line Ci is given by the following formula:

$$Ci = Cs + Cp$$

As a variant, the theoretical resistance R and the theoretical capacitance C of the RC circuit are approximations, in other words values taken from predefined ranges formed around the resistance and the capacitance of the line in the absence of driving and failure of the line. The size of the range depends on the uncertainty on these values. The time constant is then a frequency band formed about an average value. This variant makes it possible to take account of the uncertainties on and/or changes in the values of the resistances and the capacitances.

Figure 3:
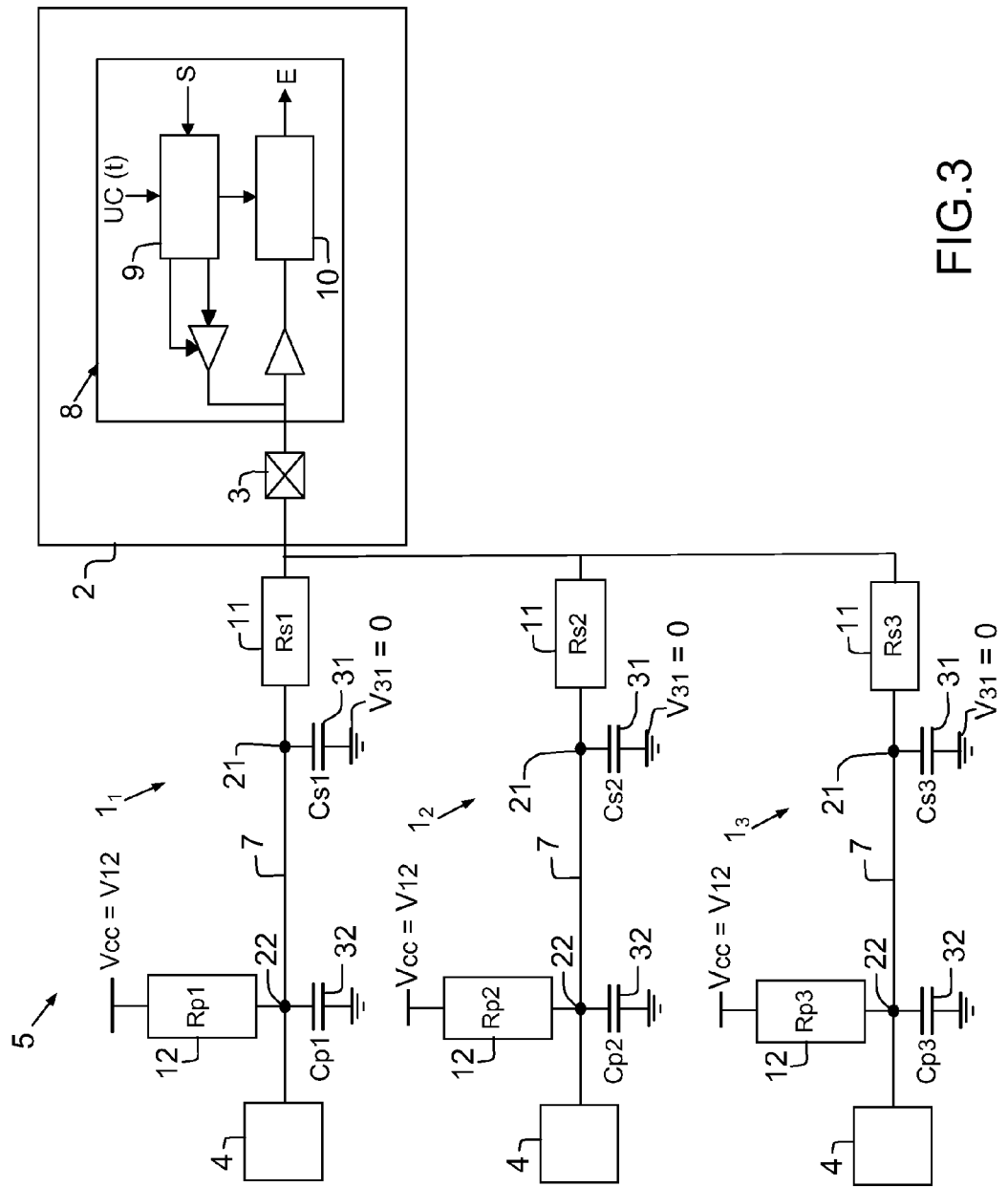

In the embodiment represented in FIG. 3, the line comprises a plurality of individual lines $1_1$, $1_2$, $1_3$ each having the same configuration as the individual line 1 represented in FIG. 1, the individual lines are star-configured around the pin 3. The capacitance and the resistance of the line are the capacitance and the resistance of all the individual lines. In the case where each individual line comprises a first resistance Rs1, Rs2, Rs3 and a second resistance Rp1, Rp2, Rp3 and a second capacitance Cs1, Cs2, Cs3 which is negligible compared to the first capacitance Cp1, Cp2, Cp3, the capacitance C of the line is substantially equal to C=Cs1+Cs2+Cs3.

The line resistance R is equal to R=Rp1//Rp2//Rp3 in which:

$$Rp1//Rp2//Rp3 = \{[(Rp1 \times Rp2)/(Rp1+Rp2)] \times Rp3\} / \{[(Rp1 \times Rp2)/(Rp1+Rp2)] + Rp3\}$$

Until the low level instant tVIL at which the theoretical voltage UBT(t–tpf) of the input/output pin 3 is equal to the maximum low level input voltage VIL, the theoretical logic level LT of the pin is the low level. When the theoretical voltage UBT(t–tpf) of the pin lies between the maximum low level input voltage VIL and the minimum high level input voltage VIH, the logic level of the pin is either the high level or the low level, but a theoretical logic level of the pin cannot be defined; this area is shaded in FIGS. 1b and 2b. From the high level instant $t_{VIH}$ the theoretical voltage UBT(t–tpf) of the pin is greater than or equal to the minimum high level input voltage VIH, the logic level LT of the pin is the high level.

The method according to the second embodiment applies to lines whose first logic level is the low level. In this embodiment, the same steps are followed as in the first embodiment, but the driving voltage UP is, as can be seen in FIG. 1b, equal to Vcc which is the potential of the first capacitor V31 so as to set the pin to the second logic level which is the low level. In reality, the driving voltage is at least equal to the minimum high level output voltage VOH above which the pin is at the high level in output mode.

In the method according to the second embodiment, the first capacitor 31 is charged (or remains charged) during the driving phase. When the first input/output pin 3 is left floating, the first capacitor is discharged with a second theoretical driving absence time constant τnp. The theoretical voltage of the pin 3 decreases to the theoretical steady state operation voltage Uperm equal to the second resistance potential V12 which is zero, as follows:

$$UBT(t-tpf)=Vcc*e^{-(t-tpf)/\tau 2}$$

As long as the theoretical voltage UBT(t−tpf) of the input/output pin 3 is greater than the minimum high level input voltage VIH ($t \leq t_{V I H'}$), the theoretical logic level LT of the pin is the high level, then, when the theoretical voltage of the pin becomes less than or equal to the maximum low level input voltage VIL ($t \geq t_{V I L'}$), the theoretical level of the pin LT is the low level.

Figure 4:
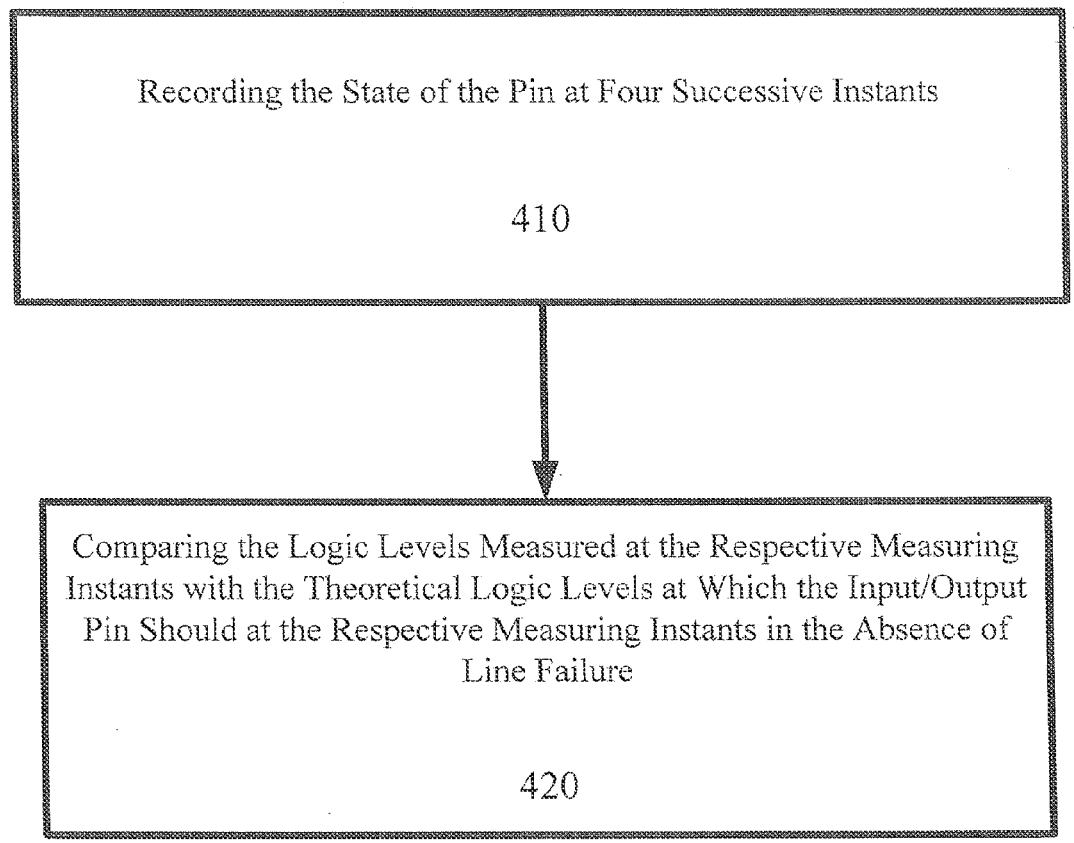

FIG. 4 diagrammatically represents methods for testing a line according to both embodiments, as represented in FIGS. 1b and 2b, at block 410, the state of the pin is recorded at 4 successive instants, namely a first tM1 and a second tM2 measuring instant at which the theoretical logic level is the second logic level and at a third tM3 and at a fourth tM4 measuring instant at which the theoretical logic level of the pin at these instants is the first logic level.

At block 420, the logic levels measured at the respective measuring instants tMi are then compared with the theoretical logic levels at which the input/output pin should be at the respective measuring instants tMi in the absence of line failure. If at least one logic level measured at a measuring instant differs from the theoretical logic level at this same measuring instant, then a failure is detected.

In the first embodiment, if, at the four measuring instants tM1, tM2, tM3, tM4, the 0 logic level is measured, it meanse thate the logic levels measured at the third and fourth measuring instants are respectively different from the theoretical logic levels at the third and fourth measuring instants. This also means that the real level of the pin remains at the second logic level during the measuring phase. In other words, the second real time constant is very great, the origin of the failure is attributed either to the fact that the line is open (the resistance of the line tends towards infinity and therefore the time constant tends towards infinity) or to the fact that the line is short-circuited to ground, for example, via a ball of solder (the capacitance of the line is zero, the line has no time constant, the pin is in the state that corresponds to the short circuit).

In the second embodiment, if, at the four measuring instants tM1, tM2, tM3, tM4, the 0 logic level is measured, the origin of the failure is attributed to the fact that the line is short-circuited to ground.

In the first embodiment, if the four measured states correspond to the high logic level, this means that the line is exhibiting a short circuit to a positive potential whose voltage is greater than the minimum high level input or output voltage.

In the second embodiment, if the four measured states correspond to the high logic level, this means that the line is exhibiting a short circuit to a positive potential whose voltage is greater than the minimum high level input or output voltage or that the circuit is open.

In both embodiments, if the measured levels change from the second logic level to the first logic level but with delay or in advance, the origin of the failure is attributed to the fact that the second real time constant is different from the second theoretical time constant.

For example, in the first embodiment, if the low level is measured at the first three measuring instants and the high level at the fourth measuring instant, the real time constant is then greater than the theoretical time constant, the line resistance and/or the line capacitance are greater than their respective theoretical values. In this embodiment, if at the first measuring instant the low level is measured and at the last three measuring instants the high level is measured, the real time constant is then less than the theoretical time constant, the line resistance and/or the line capacitance are less than their respective theoretical values. Then, the resistance R of the line 5 or the capacitance of the line 5 is wrong or there is a short circuit between two adjacent lines that modifies the resistance or capacitance of the line.

If the four levels measured at the four measuring instants are respectively identical to the four theoretical levels at the four respective measuring instants, then it can be concluded with a good rate of confidence that the real time constant of the line is equal to the theoretical time constant and that the line is not exhibiting any deficiencies.

As a variant, the logic levels are recorded at two successive instants which are a first instant at which the first theoretical logic level is the first logic level and at a second instant at which the theoretical logic level is the second logic level. The conclusions present greater uncertainty than when 4 logic levels are recorded.

In the first embodiment, if, at the measuring instants, the low level is recorded, it can be concluded that there is a short circuit to ground or that the circuit is open or that the real time constant is greater than the theoretical time constant. If, at the two measuring instants, the high logic level is recorded, it can be concluded that the second resistance is short-circuited to the power supply or that there is a real time constant that is lower than the theoretical time constant. If the low logic level is recorded first followed by the high logic level, it can be concluded that there is a real time constant equal to the theoretical time constant but the latter may also be too small or too great. It is not then possible to determine the origin of the failure.

In the second embodiment, if, at the measuring instants, the low level is recorded, it can be concluded that there is a short circuit to ground or that the real time constant is smaller than the theoretical time constant. If the high logic level is recorded at the two measuring instants, it can be concluded that the first capacitor is short-circuited to the power supply or that there is a real time constant greater than the theoretical time constant. If the high logic level is recorded first followed by the low logic level, it can be concluded that there is a real time constant equal to the theoretical time constant but the latter may also be too small or too great. It is not then possible to determine the origin of the failure.

The reliability of the method according to the invention is enhanced by choosing the first measuring instant to be as close as possible to the final driving instant and the second measuring instant to be as close as possible to the final instant.

To sum up, in the methods according to the first and second embodiments, the measured logic level of the input/output pin 3 is recorded at least one measuring instant tMi and the measured logic levels LMi are compared with the theoretical logic levels LT(tMi) at the measuring instants. If at least one measured logic level is different from the theoretical logic level, the theoretical time constant is different from the real time constant of the line, the line 5 detects a line failure. Advantageously, the logic level of the input/output pin 3 is measured at least one measuring instant at which it is possible to define the theoretical logic level of the pin, that is to say outside the time band during which the voltage of the pin lies between the minimum high level input voltage and the maximum low level input voltage.

Advantageously, the line is equipped with a means of correcting the resistance and/or the capacitance of the line to correct these values according to the difference between the theoretical time constant and the measured time constant.

Advantageously, the line is equipped with a means of correcting the line's time constant which is able to adjust the values of the capacitances and the resistances of the line before switching back to the nominal operating mode.

As a variant, the logic levels of the pin are recorded at more than four measuring points. This variant makes it possible to measure the real time constant more accurately. This variant also makes it possible to compensate for the effects of the margins to be taken with regard to the tolerances of the line's components (resistance and capacitance).

Advantageously, the line is equipped with a means of storing the measured logic levels while a test method is being implemented and a means of comparing levels measured at different stages in the life of the line. It is then possible, by comparing the different levels measured in the operational phase and in the production phase, to measure the tolerance margins of the components and compensate for them.

In a third embodiment of the method according to the invention, the first logic level of the input/output pin 3 is not known.

The driving phase is then preceded by a phase for determining the first logic level. Before the initial driving instant tpi, between a first initial instant ti and the initial driving instant tpi, a driving absence phase is applied during which the signal generator 9 does not drive the line, it leaves the pin floating. The logic level of the pin is measured in its permanent state, the measured logic level is then the first logic level. If the measured logic level is the high logic level, the method according to the first embodiment is applied, otherwise the method according to the second embodiment is applied. Such is, for example, the case with a line according to the first embodiment in which the second resistance comprises a pull-up resistance with a value Rp, as represented in FIG. 1, and a series resistance with a value Rp', arranged in series with the peripheral element 4 and connected on the one hand to the wiring 7 and on the other hand to the second node 22, that is to say between the first node 21 and the second node 22. The resistance of the individual line Ri in the absence of driving and line failure is given by the following formula: Ri=Rp+Rp'.

In all the embodiments, it is possible to measure, during the measuring step, a logic level measured at a single measuring instant and compare this measured logic level with the theoretical logic level at the measuring instant. A failure is detected if the measured logic level is different from the theoretical logic level.

What is claimed is:

1. A method for testing a line comprising an input/output pin of a programmable logic circuit, said line comprising at least one individual line extending from the input/output pin to a peripheral element, said input/output pin being able to be either at a high logic level or at a low logic level opposite to the high logic level, said method comprising the following steps: between an initial driving instant and a final driving instant, a step for driving the input/output pin in which a driving voltage is applied to the terminals of the input/output pin, from the final driving instant, a step for measuring the level of the input/output pin during which the pin is no longer driven and during which a measured logic level is recorded for the input/output pin at, at least one measuring instant, the measured logic level(s) is/are compared, at the respective measuring instant(s), with the theoretical logic level (s) at which the input/output pin should be at the respective measuring instant(s) in the absence of any line failure, when at least one logic level measured at a measuring instant differs from the theoretical logic level at said measuring instant, a line failure is detected.

2. The method for testing a line according to claim 1, wherein it is defined that, when the input/output pin is not driven:

it is at the high logic level when the voltage at its terminals is greater than a minimum high level input voltage and at the low logic level when the voltage at its terminals is less than a maximum low level input voltage, when a permanent voltage is applied to its terminals, it is at a first logic level whose value depends on the value of the permanent voltage, and in that the value of the driving voltage, applied during the driving phase of the test method, is chosen so as to place the pin at a second logic level, opposite to the first logic level, in the measuring phase, the line forms an RC circuit so that the theoretical voltage at the terminals of the input/output pin changes from the driving voltage to the permanent voltage with a theoretical driving absence time constant, the measured logic level of the input/output pin is recorded at least one measuring instant at which the theoretical voltage of the pin does not lie between the maximum low level input voltage and the minimum high level input voltage.

3. The method for testing a line according to claim 2, wherein the theoretical driving absence time constant of the RC circuit is equal to the product of the theoretical resistance and of the theoretical capacitance of the RC circuit.

4. The method for testing a line according to claim 3, wherein the theoretical resistance and the theoretical capacitance of the RC circuit are either respectively equal to the resistance and to the capacitance of the line, in the absence of driving and line failure, or respectively equal to an approximation of these values.

5. The method for testing a line according to claim 2, wherein the measured logic level is recorded at, at least one measuring instant, at which the theoretical logic level is the second logic level and at least one measuring instant at which the theoretical logic level is equal to the first theoretical logic level.

6. The method for testing a line according to claim 5, wherein the measured logic level is recorded at, at least two measuring instants, at which the theoretical logic level is the second logic level and at, at least two measuring instants, at which the theoretical logic level is equal to the first theoretical logic level.

7. The method for testing a line according to claim 5, wherein, when the failure is detected, it also comprises a step for identifying the origin of the failure according to the measured logic levels and the theoretical levels at the respective measuring instants.

8. The method for testing a line according to claim 7, wherein the logic level of the pin is recorded at a first instant and then at a second instant at which the theoretical logic level is the second logic level, then at a third instant and at a fourth instant at which the theoretical logic level is the first theoretical logic level and, if the measured logic levels change from the second logic level to the first logic level with delay, respectively in advance, relative to the theoretical logic levels, the origin of the failure is attributed to the fact that the second real time constant of the line is greater, respectively less, than the line's theoretical time constant.

9. The method for testing a line according to claim 7, wherein the logic level of the pin is recorded at a first instant and then at a second instant at which the theoretical logic level is the second logic level, then at a third instant and at a fourth instant at which the theoretical logic level is the first theoretical logic level, and:

when the first logic level is the high logic level, if, at the four measuring instants, the high logic level is recorded, the origin of the failure is attributed to a short circuit to a potential greater than the minimum high level input voltage, when the first logic level is the low logic level, if, at the four measuring instants, the low logic level is recorded, the origin of the failure is attributed to a short circuit to a potential less than the maximum low level input voltage.

10. The method for testing a line according to claim 2, wherein the first logic level is known.

11. The method for testing a line according to claim 2, wherein, prior to the driving phase, a phase for determining the first logic level is carried out, in which the input/output pin is not driven and in which the logic level of the input/output pin is measured, the measured logic level being considered to be equal to the first logic level$^2$.

* * * * *